United States Patent
Cao et al.

(10) Patent No.: US 10,468,593 B1
(45) Date of Patent: Nov. 5, 2019

(54) SCALED NANOTUBE ELECTRODE FOR LOW POWER MULTISTAGE ATOMIC SWITCH

(71) Applicant: INTERNATIONAL BUSINESS MACHINES CORPORATION, Armonk, NY (US)

(72) Inventors: Qing Cao, Yorktown Heights, NY (US); Jianshi Tang, Elmsford, NY (US); Ning Li, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/950,754

(22) Filed: Apr. 11, 2018

(51) Int. Cl.
*H01L 21/8238* (2006.01)
*H01L 45/00* (2006.01)

(52) U.S. Cl.
CPC ........ *H01L 45/085* (2013.01); *H01L 45/1266* (2013.01); *H01L 45/1616* (2013.01); *H01L 45/1625* (2013.01); *H01L 45/1658* (2013.01)

(58) Field of Classification Search
CPC .............. H01L 45/1266; H01L 45/1616; H01L 45/1625; H01L 45/1658
See application file for complete search history.

(56) References Cited

U.S. PATENT DOCUMENTS

| | | | |
|---|---|---|---|
| 5,761,115 A | 6/1998 | Kozicki et al. | |
| 8,404,189 B2 * | 3/2013 | Andresen .................. | B01F 3/02 239/429 |
| 9,006,075 B2 | 4/2015 | Quick et al. | |
| 9,224,948 B2 | 12/2015 | Liu et al. | |
| 9,711,719 B2 | 7/2017 | Jameson et al. | |
| 2006/0131555 A1 | 6/2006 | Liu et al. | |
| 2017/0186948 A1 | 6/2017 | Kim | |

OTHER PUBLICATIONS

K. Terabe et al. "Quantized conductance atomic switch" Nature (Jan. 2005) pp. 47-50, vol. 433, No. 7021.
C. Schirm et al. "A current-driven single-atom memory" Nature Nanotechnology (Sep. 2013) pp. 645-648, vol. 8, No. 9.
J. R. Jameson et al. "Subquantum conductive-bridge memory" Applied Physics Letters (Jan. 2016) pp. 053505-1-053505-5, vol. 108.
U. Celano et al. "Tuning the switching behavior of conductive-bridge resistive memory by the modulation of the cation-supplier alloys" Microelectronic Engineering (Jan. 2017) pp. 47-51, vol. 167.

* cited by examiner

*Primary Examiner* — Samuel A Gebremariam
(74) *Attorney, Agent, or Firm* — Tutunjian & Bitetto, P.C.; Vazken Alexanian

(57) ABSTRACT

A method of forming a memory device that includes depositing a first dielectric material within a trench of composed of a second dielectric material; positioning a nanotube within the trench using chemical recognition to the first dielectric material; depositing a dielectric for cation transportation within the trench on the nanotube; and forming a second electrode on the dielectric for cation transportation, wherein the second electrode is composed of a metal.

15 Claims, 5 Drawing Sheets ical Field

SCALED NANOTUBE ELECTRODE FOR LOW POWER MULTISTAGE ATOMIC SWITCH

BACKGROUND

Technical Field

The present invention generally relates to electronics having a microscale or less, and more particularly to atomic switches.

Description of the Related Art

An atomic switch is a nanoionic device that controls the diffusion of metal ions and their reduction/oxidation processes in the switching operation to form/annihilate a metal atomic bridge, which is a conductive path between two electrodes in an ON-state. Since metal atoms can provide a highly conductive channel even if their size is in the nanometer scale, atomic switches may enable downscaling to very small device dimensions. Two-terminal atomic switches have the potential for use in memories and programmable switches. Recent development of two-terminal atomic switches that use a metal oxide as the ionic conductive material, in which a metal atomic bridge is formed, has enabled the integration of atomic switches with complementary metal-oxide-semiconductor (CMOS) devices.

SUMMARY

In accordance with one embodiment, an switch, e.g., atomic switch, is provided that employs a nanotube structure, e.g., single walled carbon nanotube (SWCNT), for at least one electrode of the switch. In one embodiment, the switch includes a carbon nanotube present on a substrate to provide a first electrode of the switch. A dielectric for cation transportation is present on the first electrode. A second electrode composed of a metal is present no a surface of the dielectric for cation transportation that is opposite the surface of the dielectric for cation transportation that is in contact with the first electrode.

In another aspect, a method of forming a memory device is provided. In one embodiment, the method includes positioning a carbon nanotube within a trench of an oxide containing material. The trench is patterned to provide vias to the carbon nanotube, wherein each via to the carbon nanotubes defines a memory cell. A dielectric for cation transportation is deposited within the trench on the carbon nanotube. A second electrode is formed on the dielectric for cation transportation, wherein the second electrode is composed of a metal.

In another embodiment, a method of forming a memory device is provided that includes depositing a second dielectric material within a trench of composed of a first dielectric material; and positioning a nanotube within the trench using chemical recognition to the second dielectric material. The trench is patterned to provide vias to the carbon nanotube, wherein each via to the carbon nanotubes defines a memory cell. A dielectric for cation transportation is deposited within the trench on the carbon nanotube. A second electrode is formed on the dielectric for cation transportation, wherein the second electrode is composed of a metal.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
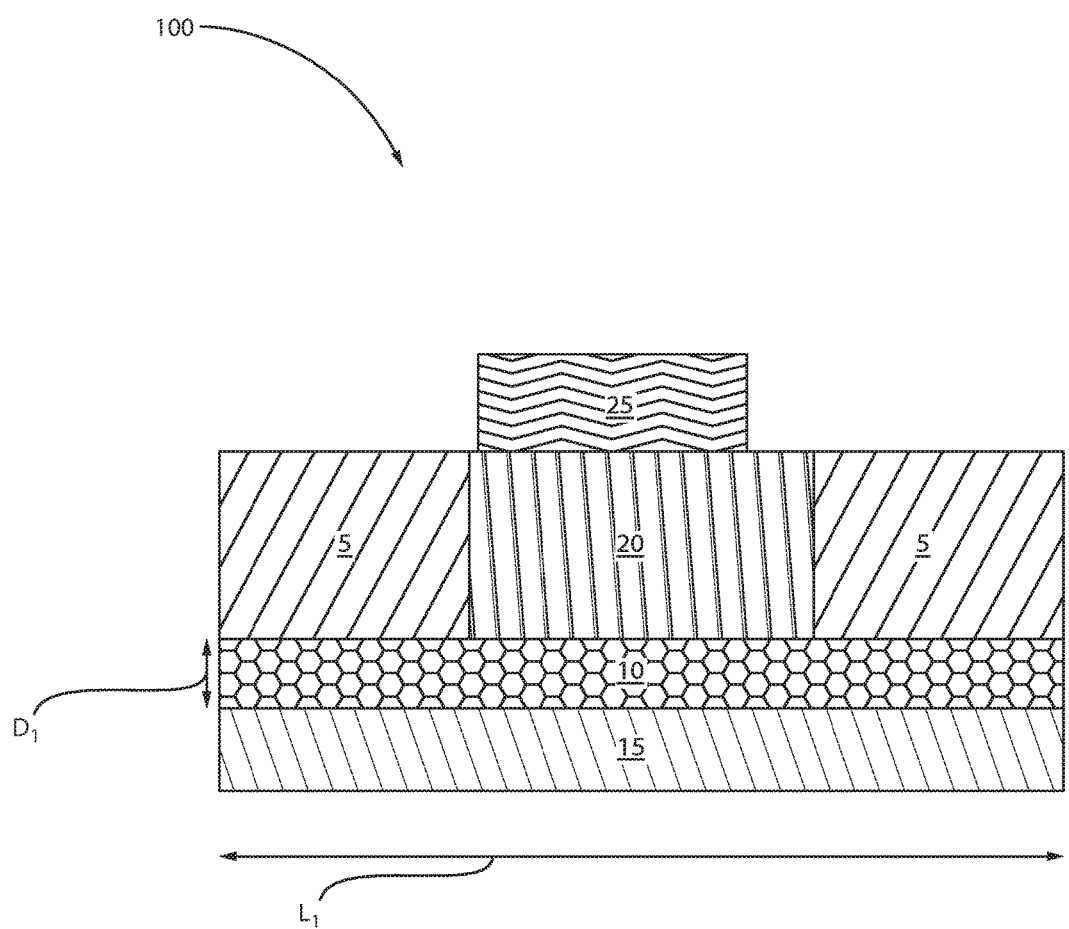
FIG. 1 is a side cross-sectional view depicting an atomic switch that may be employed in a memory application, in which the inert electrode of the atomic switch is provided by a carbon nanotube, in accordance with an embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures disclosed herein provide a structure and method for making an ultralow power atomic switch, where one electrode is provided by a nanotube. Neuromorphic computing can require memory devices with multiple states and operating at low power. It has been determined that these characteristics can be met with an atomic switch. In an atomic switch, switching occurs in a vacuum/dielectric gap through metal ion diffusion and redox reactions. Atomic switch devices can achieve both low power and quantized multiple conductance levels. However, it has been determined that with a planar electrode, the width of the filament will be very difficult to control on the atomic scale. It has further been determined that when the atomic switch having a planar electrode for the inert electrode of the device in a memory application that the difficulty in controlling the dimensions of the planar electrode can lead to unreliable multistage storage. In view of the aforementioned difficulties, a structure and method for making an ultralow power atomic switch, in which the atomic switch includes an electrode, i.e., inert anode, composed of a nanotube, such as a carbon nanotube, e.g., single walled carbon nanotube (SWCNT). The size of the nanotube, e.g., having a diameter of 1 nm, provides a surface for addition atoms of metal diffused from a metal electrode. For example, the extreme size of the nanotube provides a surface for adding silver (Ag) and/or copper (Cu) cation atoms one by one in contact with the filament provided by the carbon nanotube. Some embodiments of the methods and structures of the present disclosure are now described with reference to FIGS. 1-7.

FIGS. 1A-3 depict one embodiment of an atomic switch 100 in accordance with the present disclosure. The atomic switch 100 may include a carbon nanotube 10 is present on a substrate to provide a first electrode of the switch. The carbon nanotube 10 typically provides the inert electrode of the switch. As used herein, the term "nanotube" is meant to include single walled and multi-walled nanotubes. In one embodiment, the carbon nanotube 10 is a single walled carbon nanotube that provides the inert electrode of the atomic switch 100, in which the atomic switch 100 can be used in memory applications. In one embodiment, a carbon nanotube 10 is at least one graphene layer wrapped into a cylinder. In one embodiment, a single wall carbon nanotube 10 is a graphene rolled up into a seamless cylinder with diameter of the order of a nanometer. A multi-walled carbon nanotube 10 is a plurality of graphene sheets rolled up into a seamless cylinder with diameter of the order of a nanometer. More specifically, the diameter D1 of the carbon nanotube 10 may be equal to 1 nm or 2 nm or a value between 0.5 nm and 3 nm. As depicted in FIGS. 1A and 1B, the longest dimension L1 of the carbon nanotube 10 may extend along a dimension that is perpendicular to the top metal electrode that could serve as a word/bit line in a cross-bar array structure. In one embodiment the greatest dimension L1 of the carbon nanotube 10, as used in accordance with the methods and structures described herein ranges from about 0.5 nanometers to about 10 microns. In another embodiment, the greatest dimension L1 of a single wall nanotube ranges from about 100 nanometers to about 10 millimeters. In one embodiment, the nanotubes used in accordance with the methods and structures disclosed herein have an aspect ratio of length, i.e., longest dimension L1, to width, i.e., diameter D1, on the order of approximately 1,000:1.

In one example, the carbon nanotube 10 that provides the electrode for the atomic switch 100 is a single walled carbon nanotube (SWCNT) having a diameter ranging from 1 nm to 2 nm, and a length that ranges from about 0.5 nanometers to about 50 microns.

In one embodiment, carbon nanotubes 10 that are used in accordance with the methods and structure disclosed herein are originally produced by laser ablation have a high purity. The carbon nanotubes disclosed herein may also be originally produced using chemical vapor deposition. In one embodiment, the carbon nanotubes 10 may have a high purity on the order of about 90% carbon or greater. In another embodiment, the carbon nanotubes 10 may have a high purity on the order of about 95% to about 99% carbon. In an even further embodiment, the carbon nanotubes 10 have a purity that is greater than 99% carbon.

The carbon nanotubes 10 are typically present within a trench defined by sidewalls of silicon oxide, and on a hafnium containing layer 15 that the carbon nanotube is aligned with by chemical recognition. In some embodiments, the hafnium containing layer 15 may be composed of hafnium oxide ($HfO_2$). It is noted that hafnium oxide ($HfO_2$) is only one example of a material layer that the carbon nanotube may be aligned to using chemical recognition. In other examples, the carbon nanotubes 10 may be chemically aligned with an aluminum oxide or silicon nitride layer that is present within a trench of silicon oxide. As will be described below, the chemical recognition process that aligns the carbon nanotube to the hafnium containing material (or aluminum containing material) is selective to the hafnium containing material, e.g., hafnium oxide ($HfO_2$), (or aluminum containing material (e.g., aluminum oxide ($Al_2O_3$)), and is non selective to the silicon oxide material of the trench. This provides that the carbon nanotube 10 be aligned with the hafnium containing layer 15 at the base of the trench, and is in direct contact with the hafnium containing layer 15. The carbon nanotube 10 is not present on the trench sidewalls, which are composed of silicon oxide. In some embodiments, because a length of hafnium oxide is positioned down a length of the trench, the length of the carbon nanotube 10 is aligned with the length of the trench, i.e., the length L1 of the carbon nanotube 10 is parrallel with the length of the trench.

Although not depicted in the supplied pictures, the silicon oxide layer that the provides the trenches, in which the hafnium containing layer 15, and therefore the carbon nanotubes 10, are present is positioned on a supporting substrate. The supporting substrate may be a dielectric material, such as glass; polymeric material; or a semiconductor material, such as a type IV semiconductor, e.g., silicon, or a type III-V semiconductor material, e.g., gallium arsenide.

Figure 2:
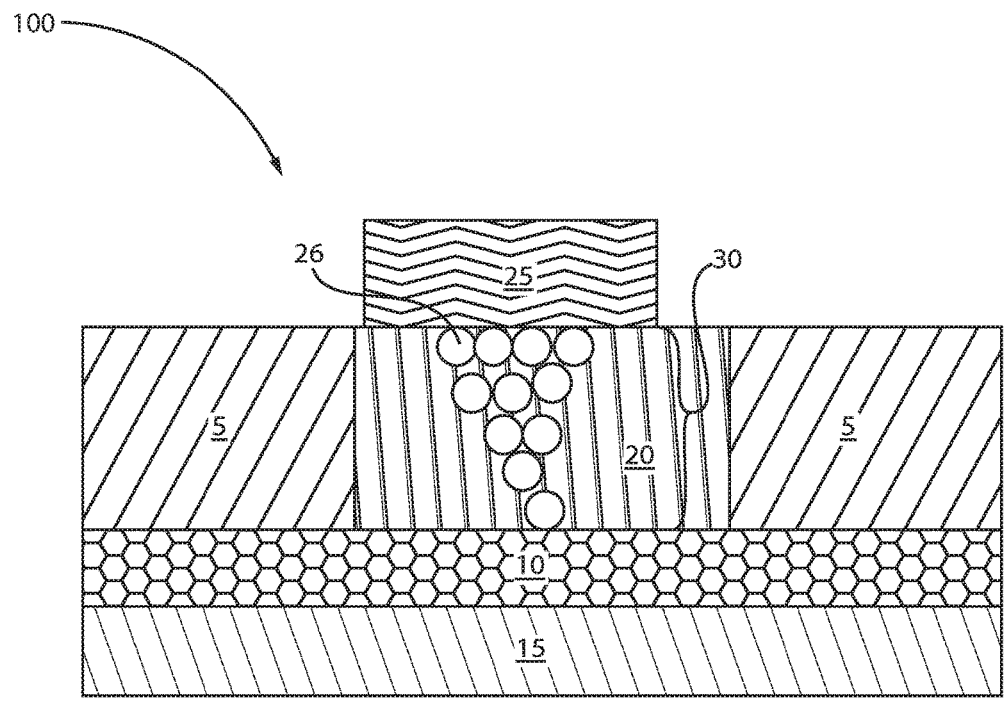
FIG. 2 is a side cross-sectional view depicting atoms having a composition similar to the reactive electrode of the atomic switch depicted in FIG. 1 during a first stage of operation.
Figure 3:
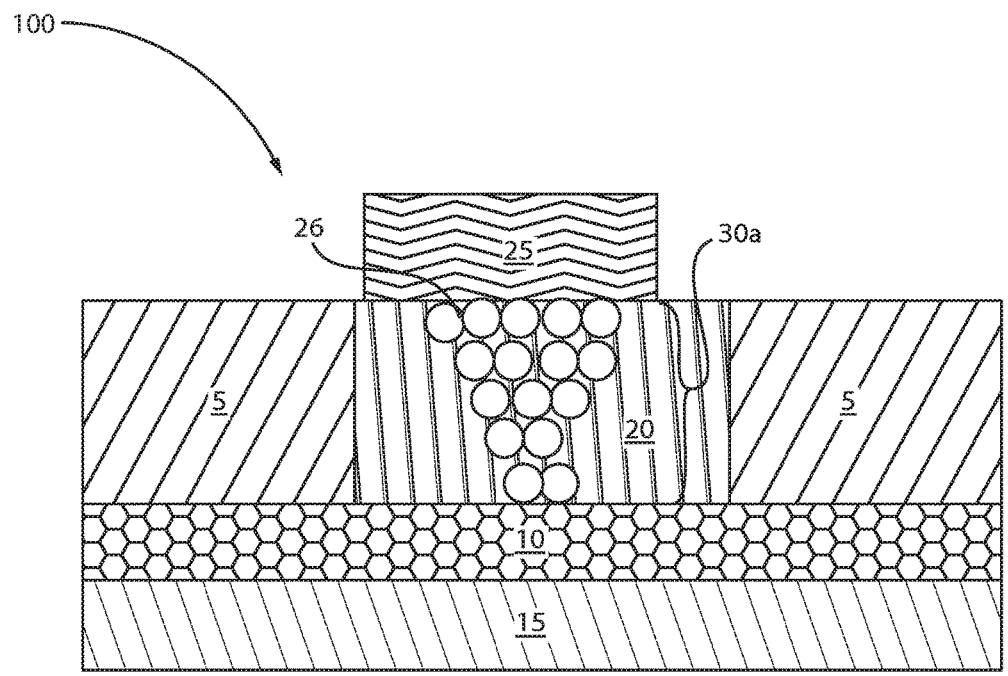
FIG. 3 is a side cross-sectional view depicting atoms having a composition similar to the reactive electrode of the atomic switch depicted in FIG. 1 during a second stage of operation.

Still referring to FIG. 1, the memory cells are defined by vias extending to the carbon nanotubes 10. The sidewalls of the vias are provided by an oxide layer 5, e.g., silicon oxide ($SiO_2$) layer. In some embodiments, a dielectric for cation transportation 20 is present on the first electrode that is provided by the carbon nanotube 10. In the final structure the dielectric for cation transportation 20 is present between an inert electrode that is provided by the carbon nanotube 10, and a reactive electrode 25 that is provided by a metal, such as silver (Ag) or copper (Cu). In operation, the mobile ions diffusing from the reactive electrode 25, are contained in the dielectric for cation transportation 20, and form a bridge between the first and second electrodes to change the conductance between the electrodes 10, 25. The bridge 30, 30a of atoms from the reactive electrode 25 that is provided by the metal is depicted in FIGS. 2 and 3, in which each circle represents an atom of metal, e.g., a silver (Ag) atom and/or a copper (Cu) atom. The dielectric for cation transportation 20 can be a semiconductor or insulator material, which can dissolve ions (providing atoms for the bridge 30, 30a, and which exhibits electronic conductivity and ionic conductivity due to the dissolution of ions, is arranged between the inert electrode provide by the carbon nanotube 10, and reactive electrode provided by the metal 25. The mobile ions that provide the bridge 30, 30a contained in the dielectric for cation transportation 20 to change the conductance of the semiconductor or insulator. The dielectric for cation transportation 20 can have a composition selected from the group consisting of $Ge_xSe_{1-x}$, $Ge_xS_{1-x}$, $Cu_2S$, $CuO$, $Ag_2S$, $TiO_2$, $ZrO_2$, $Ta_2O_5$, and $SiO_2$. The upper surface of the dielectric for cation transportation 20 can be coplanar with the upper surface of the oxide layer 5 through which the via defining the memory cells is formed.

Referring to FIG. 1, the electrode, i.e., reactive electrode 15, that provides the metal ions for the bridge 30, 30a, may be present on the upper surface of the dielectric for cation transportation 20, in which the inert electrode provided by the carbon nanotube 10 is present on the oppose lower surface of the dielectric for cation transportation. The reactive electrode 15 is provided by an electrically conductive material, such as a metal, that in response to changes in bias applied to the two terminal device can diffuse through the dielectric for cation transportation 20, and therefore change the conductivity through the dielectric for cation transportation 20. In some embodiments, the reactive electrode 15 may be provided by a metal. For example, the reactive electrode 15 may be composed of silver (Ag), copper (Cu), aluminum (Al), zinc (Zn), titanium (Ti), platinum (Pt), palladium (Pd), nickel (Ni) and combinations thereof.

Referring to FIGS. 1-3, in the application of an atomic switch 100 for memory applications, diffusion of metal ions and their reduction/oxidation processes in the switching operation to form/annihilate a metal atomic bridge 30, 30a, which is a conductive path between two electrodes 10, 25, as depicted in FIGS. 2 and 3. FIG. 2 depicting atoms having a composition similar to the reactive electrode 35 of the atomic switch 100 depicted in FIG. 1 during a first stage of operation. FIG. 3 depicts atoms having a composition similar to the reactive electrode 25 of the atomic switch 100 depicted in FIG. 1 during a second stage of operation. The number of atoms present in the conductive bridge 30a depicted in FIG. 3 is greater than the number of atoms that are present in the conductive bridge 30 that is depicted in FIG. 2. In this example, FIG. 1 may represent a low conductivity state of the atomic switch 100, or an OFF-state (0 state); while FIG. 2 may represent a high conductivity state of the atomic switch 100, or an ON-state (1 state); and FIG. 3 may represent an even higher conductivity state of the atomic switch 100, or an ON state (2 state). Referring to FIGS. 1-3, the use of the carbon nanotube 10 as the inert electrode allows for the scale of the size of the electrode down to 1 nm, in which such nanometer scale dimensions allows for precise control over the addition of atoms to the tip of the filament, i.e., end of the bridge 30, 30a in contact with the carbon nanotube 10, for multistage storage applications. For example, each atom can correspond to an electrical stage of storage. This can provide for applications in memory devices. Further, conversion of the metal atomic bridge 30, 30a between stages can be controlled by the bias applied to the electrodes 10, 25. For example, a first bias applied to the electrodes 10, 25 can convert the metal atomic bridge 30 in the stage depicted in FIG. 2 to the stage of the metal atomic bridge 30a that is depicted in FIG. 3; and a second bias, e.g., reverse bias, applied to the electrodes 10, 25 can revert the metal atomic bridge 30a from the stage depicted in FIG. 3 to the stage of the metal atomic bridge 30 that is depicted in FIG. 2 or even FIG. 1.

Some embodiments of the structures depicted in FIGS. 1-3 are now further described with a description of some embodiments for methods of forming including a Schottky contact composed of a single carbon nanotube 10 to the channel region of the device, as illustrated with reference to FIGS. 4A-7.

Figure 4A:
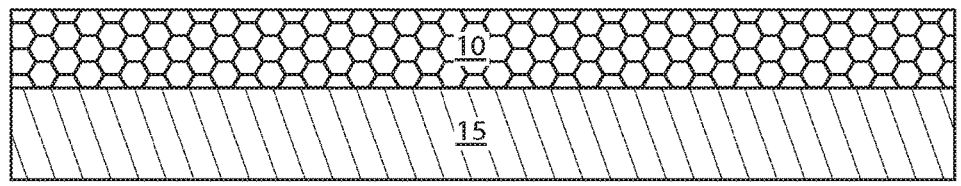
FIG. 4A is a side cross-sectional view of a method step for forming one embodiment of the atomic switch that is depicted in FIGS. 1-3, in which the method includes positioning a nanotube within a trench of an oxide containing material, in accordance with one embodiment of the present disclosure.
Figure 4B:
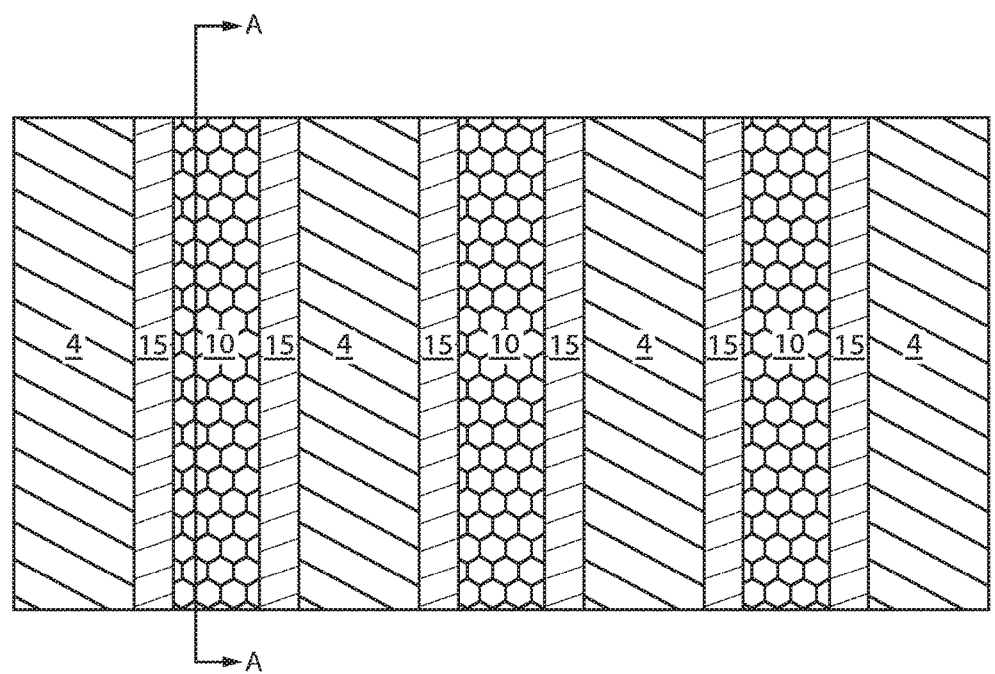
FIG. 4B is a top down view of the structure depicted in FIG. 4A, in which the side cross-sectional view depicted in FIG. 4A is along section line A-A in FIG. 4B.

FIGS. 4A and 4B depict one embodiment of method step for forming one embodiment of the atomic switch 100 that is depicted in FIGS. 1-3, in which the method includes positioning a nanotube 10 within a trench of an oxide containing material 4. The oxide containing material 4 may be silicon oxide ($SiO_2$) that is deposited on a supporting substrate (not shown). The deposition process may be by chemical vapor deposition (CVD). Variations of CVD processes suitable for depositing the oxide containing material 4 include, but are not limited to, atmospheric pressure chemical vapor deposition (APCVD), low pressure chemical vapor deposition (LPCVD), plasma enhanced chemical vapor deposition (PECVD), metal organic chemical vapor deposition (MOCVD), and combinations thereof. Formation of the oxide containing material 4 is not limited to only chemical vapor deposition methods. For example, the oxide containing material 4 may be deposited using spin on deposition, atomic layer deposition (ALD), thermal growth, e.g., low temperature oxidation, as well as other methods for forming an oxide. In one embodiment, the thickness of the layer for the oxide containing material ranges from 2.0 nm to about 500 nm.

The selection of silicon oxide ($SiO_2$) for the composition of the material layer that provides the trench is selected for illustrative purposes only, and is not intended to limit the present disclosure. Other material compositions for the material layer that provide the trench are equally applicable so long as the chemical recognition process used for positioning the carbon nanotube is non-selective, i.e., is not selective to, the composition of the material for the material layer that provides the trench.

The trench may be formed in the oxide containing material 4 using photolithography and etch processes. Specifically, in one example, a photoresist mask is formed overlying the oxide containing material 4 that provides the trench, in which the portion of the oxide containing material 4 that is underlying the photoresist mask provides the sidewalls for the trench, and exposed portions of the oxide containing material 4, which are not protected by the photoresist mask, are removed using an etch process, e.g., selective etch process, to form the trench. To provide the photoresist mask, a photoresist layer is first positioned on the layer of the dielectric material that provides dielectric fin cap. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the oxide containing material 4 that provides the trench. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

Still referring to FIGS. 4A and 4B, following the formation of the trench, a second dielectric material 15 having a different composition from the first dielectric that provides the trench is deposited within the trench. The material composition of the second dielectric material 15 is selected so that the chemical recognition process for positioning the nanotubes 10 within the trench is selective to the second dielectric material. In some examples, the second dielectric material may be a hafnium containing material or an aluminum containing material. For example, the second dielectric material 15 may be composed of hafnium oxide ($HfO_2$), aluminum oxide ($Al_2O_3$), or other basic metal oxides, or a combination thereof.

The composition of the second dielectric material 15 can be selected to be bonded with a later deposited monolayer that interacts with an anionic surfactant that encapsulates the carbon nanotube 10 for the chemical recognition process that positions the carbon nanotube 10 within the trenches so that the length of the carbon nanotube 10 is parallel to the length of the trenches. It is noted that other materials may be suitable for the dielectric layer 15 besides hafnium oxide ($HfO_2$) and aluminum oxide ($Al_2O_3$) so long as the material selected provides the selective bonding with the later formed monolayers and surfactant that is used to align a single carbon nanotube 10. In one preferred embodiment, the second dielectric layer 15 is composed of hafnium oxide ($HfO_2$). For the purposes of simplicity, and for consistency with FIGS. 1-3, the second dielectric layer 15 is hereafter referred to as the hafnium containing layer 15.

The hafnium containing layer 15 can be a deposited using chemical vapor deposition (CVD). Variations of CVD processes suitable for depositing the hafnium containing layer 15 include, but not limited to, Atmospheric Pressure CVD (APCVD), Low Pressure CVD (LPCVD) and Plasma Enhanced CVD (PECVD), Metal-Organic CVD (MOCVD) and combinations thereof. In other embodiments, the hafnium containing layer 15 may also be deposited using atomic layer deposition (ALD). Following deposition the hafnium containing layer 15 may be patterned to be present only at the base of the trenches. The patterning process may include an etch mask provided using deposition and photolithography in combinations with a selective etch process.

Figure 5:
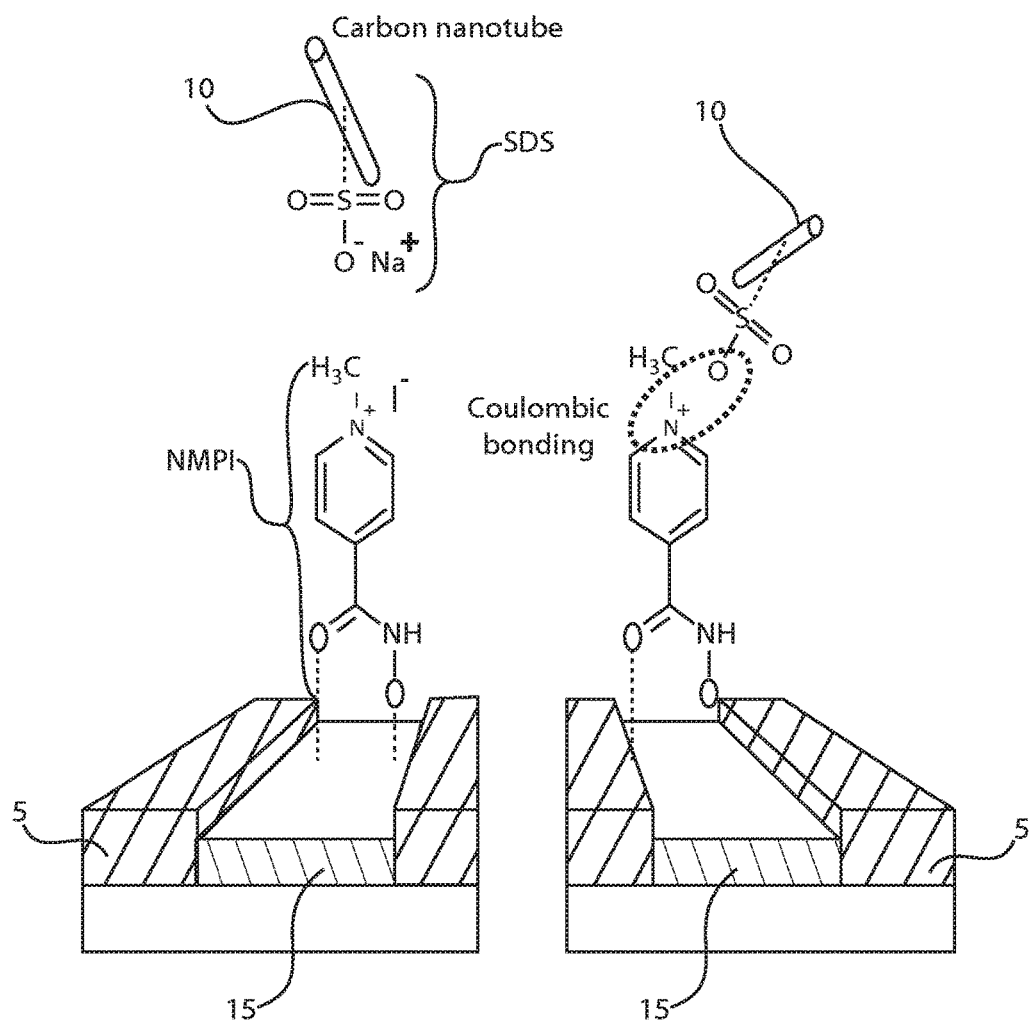
FIG. 5 is an illustration depicting chemical recognition for engaging the carbon nanotube to a dielectric positioned within the trench.

Referring to FIGS. 4A, 4B and 5, the method may continue with positioning a nanotube 10 within the trench using chemical recognition to the hafnium containing layer 15 (second dielectric material 15). In some embodiments, chemical recognition includes forming a surface monolayer on the second dielectric material and applying a surfactant to the nanotube, wherein electrostatic force resulting from ion exchange between the surface monolayer and the surfactant aligns the nanotube 10 within the trench. Referring to FIGS. 4A, 4B and 5, it is noted that a single, as in one, carbon nanotube 10 is positioned within a trench and in direct contact with the hafnium containing layer 15 to provide the inert electrode of the atomic switch 100 that can provided memory applications. However, the process described herein may be applied to multiple trenches, in which a single nanotube can be aligned with the hafnium containing layer 15 of a single trench, i.e., one nanotube to one trench.

FIG. 5 depicts chemical recognition for engaging the carbon nanotube 10 to hafnium containing layer 15 within the trench. The chemical recognition process may include forming a surface monolayer on the hafnium containing layer 15 and applying a surfactant to the carbon nanotube 10, wherein electrostatic force resulting from ion exchange between the surface monolayer and the surfactant aligns the nanotube 10 to the base portion of the trench into direct contact with the surface monolayer on the hafnium containing layer 15. The surface monolayer that may be formed on the hafnium containing layer 15 through the application of 4-(N-hydroxycarboxamido)-I-methylpyridinium iodide (NMPI), wherein the surface monolayer includes a hydroxamic acid end group that self assembles on the hafnium containing layer 15. In some embodiments, in which the hafnium containing layer 15 is composed of hafnium oxide ($HfO_2$), the surface monolayer includes a hydroxamic acid end group that self assembles on the hafnium oxide ($HfO_2$) but not on silicon oxide ($SiO_2$), such as the silicon oxide surfaces of the trench.

In some embodiments, the surface monolayer formed on the hafnium containing layer 15 can be formed from NMPI molecules that may be synthesized in two steps from the methyl isonicotinate. Methyl isonicotinate can be converted to its corresponding hydroxamic acid, 4-(N-hydroxycarboxamido)pyridine. Methyl iodide (10 g) can then be added to a solution of 4-(Nhydroxycarboxamido)pyridine (5.14 g, 0.03 mol) in 200 ml of methanol, and the mixture may be stirred at room temperature for a time period on the order of approximately 3 days. The precipitate is filtered and washed with methanol and dried. Crystallization from 9:1 ethanol-water provides analytically pure pyridinium compound NMPI as light yellow crystals (7.35 g, 84%).

The surfactant on the carbon nanotube 10 can be provided by sodium dodecyl sulphate (SDS). The surfactant is an anionic surfactant. Following formation of the surface monolayer on the hafnium containing layer 15 and encapsulation of the carbon nanotube 10 in the surfactant, the carbon nanotubes and the hafnium containing layer 15 are brought together in an aqueous solution during which the chemical recognition process positions a single carbon nanotube 10 within the trench so that the length of the carbon nanotube 10 is parrallel with the length of the hafnium containing layer, and therefore, the length of the carbon nanotube 10 is aligned to be parrallel with the length of the trench.

The carbon nanotubes 10 can be functionalized by positioning the carbon nanotubes in an aqueous solution in which the anionic surfactant, e.g., SDS, is added or present. The anionic surfactant is not limited to only SDS, in which the anionic surfactant may also be a carboxylate, a sulphonate, a petroleum solphonate, alkybenzenesulphonates, napthalenensulphonate, olefin oils and fats, sulphated esters, sulphated alkanolamides, and alkylphenols that are either ethoxylated or sulphated. In some embodiments, the anionic surfactant wraps around the carbon nanotubes 10 leading to strong coulombic attraction between the negatively charged surfactant and the positively charged monolayer.

In some embodiments, to functionalize the carbon nanotubes 10, a solution of carbon nanotubes is formed with 1% aqueous SDS prepared via horn sonication. The solution may be then purified using a step-gradient ultracentrifugation process. The purified nanotube solution sedimented at the interface of the two layers while the graphitic impurities and large bundles settled to the bottom of the centrifuge tube. The purified nanotube solution can then be removed via pipette and diluted 1:1 with 1% aqueous SDS solution.

In some embodiments, the sequence of monolayer formation on the hafnium containing layer 15 and functionalization of the carbon nanotubes 10 includes cleaning the hafnium containing layer 15 by oxygen plasma at 300 mtorr for 5 min. In one example, the NMPI monolayer may then be assembled on the exposed surface of the hafnium containing layer 15 by placing the structure including the hafnium containing layer 15 in a 3.5 mM solution of NMPI (3:1 ethanol/water) for a time period on the order of approximately 1 hour (h). The surface of the hafnium containing layer 15 may then be rinsed with ethanol. The structure, i.e., trench containing structure having the hafnium containing layer 15 present therein, can then be positioned horizontally with its surface facing upwards in a dialysed nanotube solution for 1 h, without an agitation. A single carbon nanotubes 10 selectively deposits on the exposed portion of the hafnium containing layer 15 within the trench. After nanotube deposition, the structure can be rinsed flowing deionized water for 30 seconds and subsequently rinsing the structures in a sonication bath with deionized water for 1 min.

It is noted that the above description provides one example of a chemical recognition process that can position a nanotube 10 on the surface of the dielectric layer 15 that is overlying the type III-V semiconductor substrate 1 and is between the ohmic contacts 4, 5. The oxide material 20 that provides the trench 25 does not interact with the chemical recognition process, and the dimensions of the trench 25 facilitate the positioning of the longest dimension L1 of the carbon nanotube 10 to be perpendicular to the gate length. In addition to the chemical recognition process for depositing the single carbon nanotube 10 within the trench 25, the trench dimensions of the repulsive force of the negatively charged carbon nanotubes 10 provides that only one single carbon nanotube 10 can be positioned in the trench 25.

FIG. 5 illustrates the formation of the monolayer on a dielectric layer of hafnium oxide ($HfO_2$) using NMPI. FIG. 5 also illustrates the carbon nanotube 10 being functionalized with SDS. FIG. 5 depicts the Coulombic reaction between the monolayer formed from NMPI and the carbon nanotube 10 that has been functionalized with SDS that positions the carbon nanotube 10 within the trench. As noted above, the nanotube 10 can be a single walled carbon nanotube (SWCNT) having a diameter D1 ranging from 1 nm to 2 nm, and a length that ranges from about 0.5 nanometers to about 10 microns.

Figure 6:
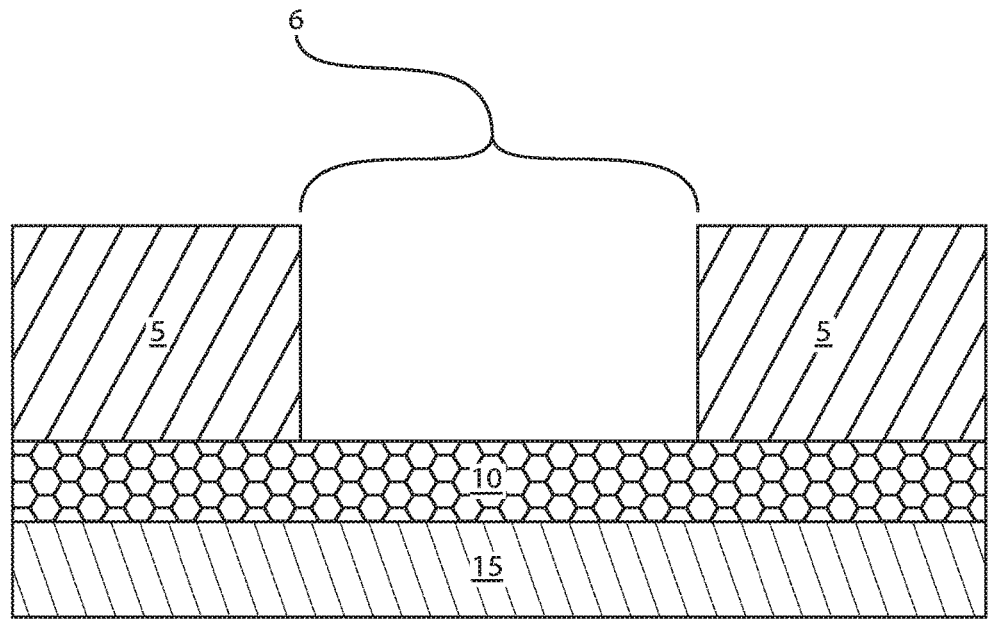
FIG. 6 is a side cross-sectional view depicting patterning a via to the carbon nanotube, wherein the via to the nanotube defines a memory cell, in accordance with one embodiment of the present disclosure.

FIG. 6 depicts patterning a via 6 to the carbon nanotube 10, wherein the via 6 to the nanotube 10 defines a memory cell. In some embodiments, forming the via 6 may begin with deposition an oxide layer 5, such as silicon oxide ($SiO_2$), on the surface of the structure depicted in FIGS. 4A and 4B. The deposition process may include chemical vapor deposition, such as Atmospheric Pressure CVD (APCVD), Low Pressure CVD (LPCVD) and Plasma Enhanced CVD (PECVD), Metal-Organic CVD (MOCVD) and combinations thereof. In other embodiments, the oxide layer 5 may be deposited using spin on deposition. It is further noted, that the oxide composition for the oxide layer 5, such as silicon oxide, is provided for illustrative purposes, and is not intended to limit the present disclosure. Additionally other types of dielectrics can be substituted for the oxide layer 5. For example, in other embodiments, other interlevel dielectric materials can be substituted for the silicon oxide composition that is described above for the oxide layer 5, such as nitrides, e.g., silicon nitride ($Si_3N_4$).

Following deposition, the oxide layer 5 may be patterned and etched to provide the via 6. The via extends through the entire thickness and exposes a portion of the carbon nanotube 10. The pattern and etch processed for forming the via 6 are similar to those for forming the trench, as described above with reference to FIGS. 4A and 4B. However, when etching the oxide layer 5, in some embodiments, the etch chemistry may be selective to the carbon nanotube 10. This provides that the material removed from the oxide layer 5 to provide the via 6 does not remove the carbon nanotube 10.

Figure 7:
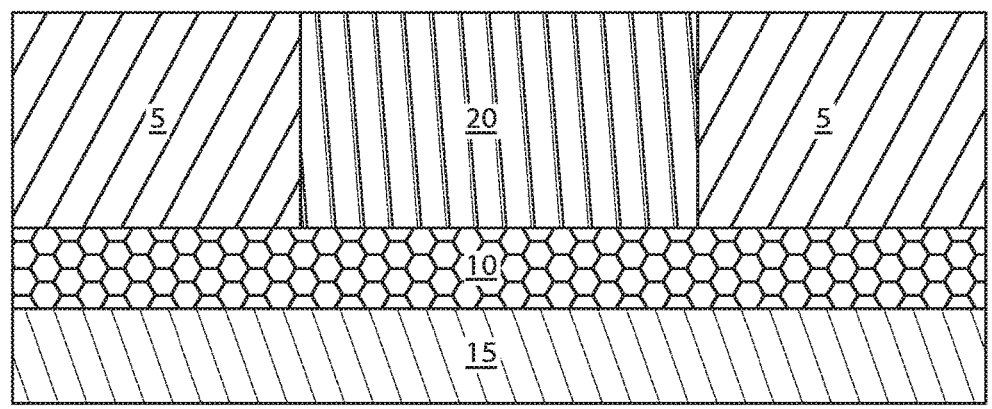
FIG. 7 is a side-cross sectional view depicting depositing a dielectric for cation transportation within the via on the carbon nanotube, in accordance with one embodiment of the present disclosure.

FIG. 7 depicts depositing a dielectric for cation transportation 20 within the via 6 on the carbon nanotube 10. In some examples, the dielectric for cation transportation 20 has a composition selected from the group consisting of $Ge_xSe_{1-x}$, $Ge_xS_{1-x}$, $Cu_2S$, $CuO$, $Ag_2S$, and $SiO_2$. The deposition process for filling the via with the dielectric for cation transportation 20 may include chemical vapor deposition, such as Atmospheric Pressure CVD (APCVD), Low Pressure CVD (LPCVD) and Plasma Enhanced CVD (PECVD), Metal-Organic CVD (MOCVD) and combinations thereof. In other examples, the deposition process for filling the via with the dielectric for cation transportation 20 may include dip coating, spin-coating, brush coating, chemical solution deposition, physical vapor deposition, and plating. In some embodiments, following deposition, to provide that the upper surface of the dielectric for cation transportation 20 is coplanar with the upper surface of the oxide layer 6 through which the via 6 is formed, the upper surface of the dielectric for cation transportation 20 may be planarized. In one example, the upper surface of the dielectric for cation transportation 20 may be planarized by chemical mechanical planarization (CMP).

Referring to FIG. 1, in a following process step, a second electrode, i.e., reactive electrode 25, is formed on the dielectric for cation transportation 20. The second electrode is composed of a metal. In some examples, the second electrode may have a composition that is selected from the group consisting of silver (Ag), copper (Cu), aluminum (Al), zinc (Zn) and combinations thereof.

The second electrode, i.e., reactive electrode 25, may be formed by depositing a metal layer, e.g., blanket depositing, on the upper surface of the dielectric for cation transportation 20, and then patterning and etching the deposited metal layer to remove the portion of the layer that is not present over the dielectric for cation transportation 20. The metal layer that provides the second electrode, i.e., reactive electrode 25, may be deposited using a physical vapor deposition process, such as plating, electroplating, electroless plating, sputtering and combinations thereof. In other embodiments, the metal layer may be deposited using chemical vapor deposition and/or atomic layer deposition.

Following deposition of the metal layer, a pattern and etch process removes the portion of the metal layer that is not present over the dielectric for cation transportation 20. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections of the metal layer covered by the photoresist are protected, while the exposed regions of the metal layer are removed using a selective etching process that removes the unprotected regions. The portions of the metal layer that remain following the etch step provides the second electrode, i.e., reactive electrode 25. The selective etch process may be an anisotropic etch, such as reactive ion etch, or an isotropic etch, such as a wet chemical etch. Next the photoresist pattern is removed.

It is to be understood that aspects of the present invention will be described in terms of a given illustrative architecture; however, other architectures, structures, substrate materials and process features and steps can be varied within the scope of aspects of the present invention.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a scaled nanotube electrode for a low power multistage atomic switch (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a memory device comprising:
positioning a carbon nanotube within a trench of an oxide containing material;
patterning the trench to provide a via to the carbon nanotube, wherein the via to the carbon nanotubes defines a memory cell;
depositing a dielectric for cation transportation within the trench on the carbon nanotube; and
forming an electrode on the dielectric for cation transportation, wherein the electrode is composed of a metal.

2. The method of claim 1, wherein the carbon nanotube is a single wall carbon nanotube (SWCNT) having a diameter D1 ranging from 1 nm to 2 nm, and a length that ranges from about 0.5 nanometers to about 10 microns.

3. The method of claim 1, wherein the dielectric for cation transportation has a composition selected from the group consisting of $Ge_xSe_{1-x}$, $Ge_xS_{1-x}$, $Cu_2S$, $CuO$, $Ag_2S$, $TiO_2$, $ZrO_2$, $Ta_2O_5$, and $SiO_2$.

4. The method of claim 1, wherein the electrode is of said metal having a composition selected from the group consisting of silver (Ag), copper (Cu), aluminum (Al), zinc (Zn) and combinations thereof.

5. A method of forming a memory device comprising:
depositing a second dielectric material within a trench of composed of a first dielectric material;
positioning a nanotube within the trench using chemical recognition to the trench dielectric material;
depositing a dielectric for cation transportation within the trench on the nanotube; and
forming an electrode on the dielectric for cation transportation, wherein the electrode is composed of a metal.

6. The method of claim 5, wherein the second dielectric material comprises a hafnium including oxide.

7. The method of claim 5, wherein the first dielectric material comprises a silicon including oxide.

8. The method of claim 5, wherein said chemical recognition comprises forming a surface monolayer on the first dielectric material and applying a surfactant to the nanotube, wherein electrostatic force resulting from ion exchange between the surface monolayer and the surfactant aligns the nanotube within the trench.

9. The method of claim 8, wherein the surface monolayer is formed from 4-(N-hydroxycarboxamido)-I-methylpyridinium iodide (NMPI).

10. The method of claim 8, wherein surface monolayer includes a hydroxamic acid end group that self assembles on the second dielectric material.

11. The method of claim 9, wherein the surfactant on the nanotube is provided by sodium dodecyl sulphate (SDS).

12. The method of claim 5, wherein the nanotube is a single wall carbon nanotube (SWCNT) having a diameter D1 ranging from 1 nm to 2 nm.

13. The method of claim 5, wherein the nanotube has a length that ranges from about 0.5 nanometers to about 10 microns.

14. The method of claim 5, wherein the dielectric for cation transportation has a composition selected from the group consisting of $Ge_xSe_{1-x}$, $Ge_xS_{1-x}$, $Cu_2S$, $CuO$, $Ag_2S$, $TiO_2$, $ZrO_2$, $Ta_2O_5$, and $SiO_2$.

15. The method of claim 5, wherein the electrode is of said metal having a composition selected from the group consisting of silver (Ag), copper (Cu), aluminum (Al), zinc (Zn) and combinations thereof.

* * * * *